United States Patent [19]

Schrag et al.

[11] Patent Number: 4,746,869
[45] Date of Patent: May 24, 1988

[54] CIRCUIT FOR TESTING INDUCTIVE COILS

[75] Inventors: Thomas G. Schrag, Hesston, Kans.; Charles F. Hood; Scott A. Morton, both of Ranchester, Wyo.

[73] Assignee: Hesston Corporation, Hesston, Kans.

[21] Appl. No.: 61,093

[22] Filed: Jun. 10, 1987

[51] Int. Cl.⁴ .......................................... G01R 31/06
[52] U.S. Cl. ...................................................... 324/546
[58] Field of Search ................... 324/546, 547, 502; 340/644, 660, 661, 664

[56] References Cited

U.S. PATENT DOCUMENTS 4,178,542 12/1979 McCarthy ........................... 324/546

Primary Examiner—Reinhard J. Eisenzopf
Assistant Examiner—Anthony L. Miele
Attorney, Agent, or Firm—Hovey, Williams Timmons & Collins

[57] ABSTRACT

An electrical circuit is provided for testing for an open circuit or short circuit in an inductive coil, solenoid, or the like. The preferred circuit includes a computer activated device for selectively imposing a direct current voltage on a coil, a detector for detecting current flow through the coil induced by the voltage and for producing a current flow signal indicative of the magnitude of the current flow, a comparator for comparing the current signal with the reference signal and for producing respective first and second comparison signals when the current flow magnitude is respectively less than or greater than a reference magnitude, and a computer for determining whether the respective first and second comparison signals are produced during respective first and second points in time, such being a test indicative of the electrical integrity of the coil, solenoid, or the like.

19 Claims, 2 Drawing Sheets

CIRCUIT FOR TESTING INDUCTIVE COILS

BACKGROUND OF THE INVENTION

1. Field of the Invention

The present invention relates to an electrical circuit for testing the electrical integrity of an inductive coil, solenoid, or the like. More particularly, the present invention is concerned with a circuit including a computer for testing whether the coil, solenoid, or the like has an open circuit or a short circuit.

2. Description of the Prior Art

Many machines and articles of manufacture use inductive coils, solenoids, or the like to perform various important functions. For example, a magnetic coil might be used to count revolutions of a rotating member whereby a metal segment on the rotating member induces a voltage pulse in the magnetic coil with each revolution of the member. Additionally, for example, solenoids are used to actuate hydraulic cylinders.

In many of these applications a failure of the coil or solenoid may be undetected and may lead to serious consequences if the coil or solenoid failure remains unknown. For example, if a magnetic sensor coil becomes short circuited or electrically open, it will not respond to the passage of the metal segment to induce a voltage pulse when it should. The absence of an electrical pulse is likely to go undetected.

Furthermore, if a hydraulic cylinder solenoid becomes electrically shorted or open, it will fail to actuate or deactuate a cylinder which can lead to mechanical damage in the machine or to the product which it is producing.

As a further example, solenoid actuated hydraulic cylinders are commonly used on hay balers with the source of operating power for the solenoids being the electrical system of the tractor pulling the hay baler. In such applications, the output voltage from the electrical system can vary from its nominal 12 volts as the electrical load on the electrical system varies. The variable supply voltage supplied to the solenoid makes it difficult to design a test circuit for on-line testing of the electrical integrity of the solenoid—that is, whether the solenoid is electrically open or short. Additionally, an on-line test of an electrical solenoid must be such that the test itself does not actuate the solenoid, a fact which further complicates the design process.

Finally, a system for on-line checking of the integrity of coils, solenoids, or the like is enhanced if the testing is done automatically without the need for operator intervention to initiate the test, and is further enhanced if an alarm is sounded or displayed in the event the coil, solenoid, or the like is defective.

SUMMARY OF THE INVENTION

The problems as outlined above are solved by the circuit and method in accordance with the present invention. That is to say, the present invention provides for automatic on-line testing of the electrical integrity inductive coils, solenoids, or the like without actuating these components and while compensating for variations in supply voltage.

The invention hereof takes advantage of the fact that when a direct current voltage is imposed on an inductive element, the current flow therethrough is initially low and then rises exponentially over time. An inductive element which is electrically shorted will allow an initially high current flow and an element which is electrically open will allow no current rise, both circumstances being indicative of a defect in the element.

The preferred circuit includes an activatable voltage means for imposing a direct current voltage on the coil, solenoid, or the like in order to induce current flow therethrough in response to the voltage; means for detecting current flow through the coil, solenoid, or the like and for producing a current flow signal indicative thereof; a comparator for comparing the current flow signal with a reference signal in order to produce respective first and second comparison signals when the current flow magnitude is respectively less than and greater than a reference magnitude; and determining means for determining whether the first comparison signal is received during a first point in time after the voltage is imposed on the coil, solenoid, or the like and whether the second comparison signal is received during a later second point in time while the voltage is still imposed.

The preferred determining means includes a digital computer for receiving the comparison signals and for activating the voltage means to impose the voltage on the coil, solenoid, or the like. Advantageously, the circuit also includes an alarm which is actuated when the first comparison signal is absent during the first point in time, and when the second comparison signal is absent during the second point in time.

Desirably, the time interval between the time when the voltage is initially imposed and the second point in time is less than the time required to actuate the coil, solenoid, or the like so that the electrical integrity test is complete before actuation of any mechanism operatively coupled therewith. Additionally, the preferred circuit includes means for sensing variations in the imposed voltage imposed and for varying the reference signal in a manner corresponding to the variations in the voltage.

The preferred method of testing the electrical integrity of an inductive coil, solenoid, or the like includes the steps of activating a test output from a computer in order to impose a direct current voltage on the coil, solenoid, or the like in order to induce a current flow therethrough; determining whether the computer is receiving a first signal during the first point in time which indicates that the current flow is less than a reference magnitude; determining whether the computer is receiving a second signal during the second point in time indicative of the current flow being greater than the reference magnitude; and deactivating the test output.

DESCRIPTION OF THE PREFERRED EMBODIMENTS

Figure 1:
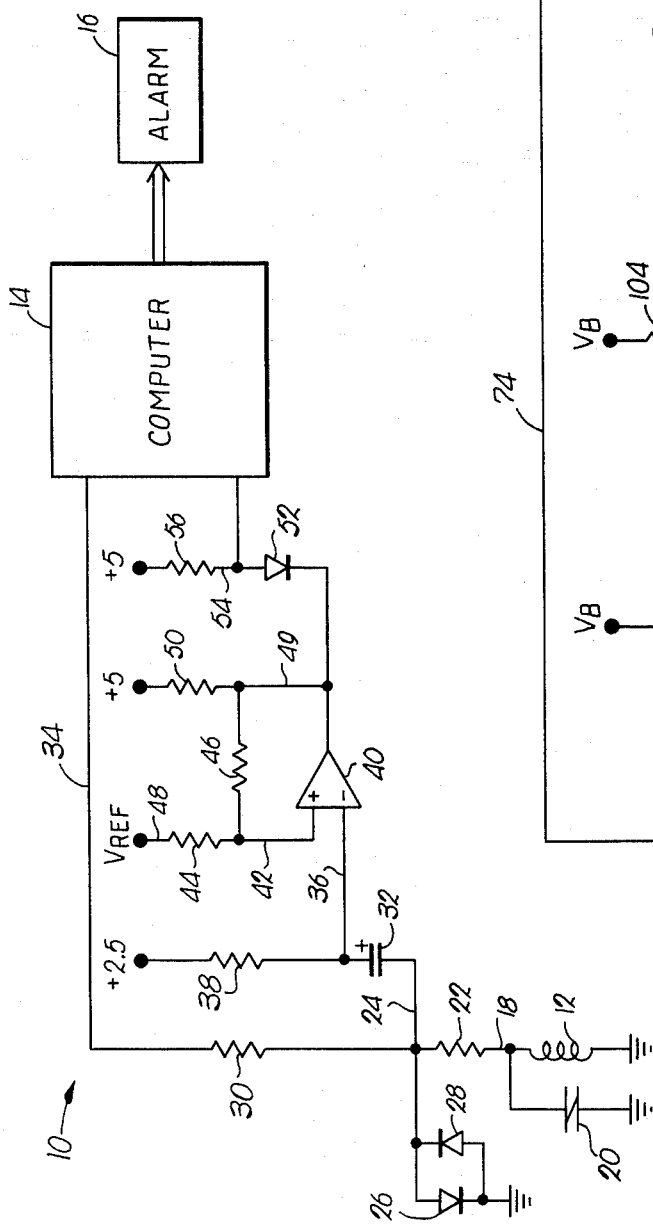
FIG. 1 is a partial schematic and partial block diagram of the first embodiment of the present invention.

Referring now to the drawing figures, Fig. 1 illustrates circuit 10 of the present invention configured according to the first embodiment. Circuit 10 is particularly advantageous when inductive coil 12 is a conventional magnetic sensor such as that produced by Wabash Company as variable reluctance sensor 60-0128 typically used for counting revolutions of a rotating member (not shown). The rotating member includes a metallic element which induces a voltage pulse or spike on the output of coil 12 with each passage thereby.

Circuit 10, in addition to other components which will described further hereinbelow, also includes computer 14 and alarm unit 16. Computer 14 is preferably a conventional microcomputer coupled to a conventional alarm unit 16 which desirably sounds an audible alarm and displays a visual indication (not shown) when actuated by computer 14.

Circuit 10 is particularly advantageous in that it serves the dual purpose of a test circuit for inductive coil 12 and as an input buffering circuit for computer 14. Circuit 10 is supplied with operating power from a conventional power supply designed to supply operating power at +5 v.d.c., +2.5 v.d.c, and a reference voltage ($V_{REF}$) supplied at +2.71 v.d.c. The particular voltage of $V_{REF}$ is a matter of design choice depending on the inductance of the particular coil being tested and operated, and depending upon the value of other components in circuit 10. In the discussion hereinafter, the preferred values of the various components will be indicated when the component is first mentioned.

In circuit 10, one side of coil 12 is coupled to ground as shown, and the other side is coupled via line 18 to one side of EMI suppression filter 20 and to one side of resistor 22 (1K ohms). The other side of filter 20 is coupled to system ground as shown and is used for radio frequency suppression. The other side of resistor 22 is coupled via line 24 to the anode of diode 26, to the cathode of diode 28, to one side of resistor 30 (75K ohms) and to one side of capacitor 32 (4.7 microfarads).

The cathode of diode 26 and the anode of diode 28 are coupled to system ground as shown. The inherent junction drop of diode 26 limits the voltage rise on line 24 to about +0.7 v.d.c. Similarly, the junction drop of diode 28 limits the negative voltage rise on line 24 to about −0.7 v.d.c.

The other side of resistor 30 receives the test output from computer 14 via line 34.

The other side of capacitor 32 is coupled via line 36 to one side of resistor 38 (100K ohms) and to the negative input terminal of conventional voltage comparator 40 (National Semiconductor LM2903). The other side of resistor 38 is coupled to +2.5 v.d.c. which biases line 36 to a midrange of +2.5 v.d.c.

The positive input terminal of comparator 40 is coupled via line 42 to one side of resistor 44 (33K ohms) and to one side of resistor 46 (2.2M ohms). The other side of resistor 44 is coupled via line 48 to terminal $V_{REF}$ at +2.71 v.d.c. which is the reference voltage supplied to the positive input terminal of comparator 40.

The other side of resistor 46 is connected via line 49 to the output of comparator 40 and to one side of resistor 50 (10K ohms). Resistor 46 is used to provide hysteresis in the operation of comparator 40.

The output of comparator 40 via line 49 is also connected to the cathode of diode 52. The anode of diode 52 is connected via line 54 to one side of resistor 56 (100K ohms). The other side of resistor 56 is connected to +5 v.d.c. Line 54 is also coupled to computer 14 and serves as the output line for delivering first and second comparison signals thereto.

In the operation of circuit 10, and before initiation of the a test output on line 34, line 34 is logic low at zero volts. The negative input terminal of compartor 40 is biased at +2.5 v.d.c. via resistor 38 and line 36, and capacitor 32 is charged to the biasing voltage at +2.5 v.d.c.

The positive input terminal to comparator 40 is biased at +2.71 v.d.c. from terminal $V_{REF}$ via line 48, resistor 44, and line 42. Because the reference voltage +2.71 v.d.c. is higher than the biasing voltage (+2.5) at the negative input terminal, the output of comparator 40 is logic high, line 49 is pulled high to +5 v.d.c. via resistor 50, and line 54 is pulled high to +5 v.d.c. via resistor 56.

The design of circuit 10 is configured so that whenever voltage is imposed on coil 12 via line 34, and when the magnitude of the current flow therethrough is below a reference magnitude, comparator 40 produces a first comparison signal as logic low which is delivered via line 54 to computer 14. Conversely, when the current flow through coil 12 as induced by the voltage line 34 is greater than the reference magnitude, comparator 40 produces a second comparison signal as logic high which is delivered via line 54 to computer 14. Thus, the operation of circuit 10 takes advantage of the fact that when the voltage is initially imposed on coil 12, current flow is low and exponentially rises over time to a level greater than the reference magnitude. The reference current flow magnitude is effectively determined by voltage $V_{REF}$ and can be changed by changing the voltage of $V_{REF}$.

To test coil 12, computer 14 activates a test output via line 34 at +5 v.d.c. The voltage on line 34 induces current flow via resistor 30, line 24, resistor 22, and line 18 through coil 12 to system ground. When the voltage on line 34 initially goes high at +5 v.d.c., current flow through coil 12 is inhibited by the reluctance thereof, and the voltage on line 24 experiences a rise of about 0.4 volts as determined by the values of resistors 30 and 22. The voltage rise on line 24 is transmitted via coupling capacitor 32 to line 36 which experiences a voltage rise from the biasing voltage of 2.5 volts to about +2.9 v.d.c. which is the input to the negative terminal of comparator 40. Since the voltage of a negative input terminal comparator 40 at 2.9 volts exceeds the reference voltage on the positive input terminal at 2.71 volts, the output of comparator 40 changes state from logic high to logic low and sinks current to pull down the voltage on line 49 and line 54 to zero volts. That is to say, comparator 40 produces and transmits the first comparison signal as logic low to computer 14.

As the current flow through coil 12 rises, the voltage on line 24 correspondingly falls as does the voltage on line 36 to the negative input terminal of comparator 40. When the voltage on line 36 falls below the reference voltage on the positive terminal of comparator 40 (which corresponds to a rise in current flow through coil 12 above the reference magnitude), comparator 40 changes state to logic high in order to produce the second comparison signal on line 49 at +5 v.d.c. which is delivered via line 54 to computer 14.

Computer 14 can determine whether the electrical integrity of coil 12 is intact by reading the input on line 54 at appropriate times. That is to say, if coil 12 does not have an open or short circuit, then computer 14 should receive a logic low signal on line 54 shortly after the test output on line 34 is activated, and should experience a logic high signal after a time sufficient for the current flow through coil 12 to rise above the reference magnitude. The first point in time during which computer 14 should receive the first comparison signal as logic low is 0.5 milliseconds after the test output on line 34 is activated. The second point in time during which computer 14 should receive the second comparison signal as logic high indicating that the current flow through coil 12 is above the reference magnitude is 5 milliseconds after the test output on line 34 is activated. These first and second points in time during which computer 14 reads the input on line 54 are determined by the values of the particular components included in circuit 10 and are thus a matter of design choice.

If the integrity of coil 12 is not intact, computer 14 will not receive the first and second comparison signals at the first and second comparison signals at the first and second points in time, and is programmed to then activate alarm 16. For example, if coil 12 is shorted to ground, it will not inhibit current flow when the test output on line 34 is initiated, and as a result, line 24 and 36 will not experience a sufficient voltage rise, the output of comparator 40 will not go low, and computer 14 will not receive the first comparison signal as logic low on line 54 at the first point in time (0.5 milliseconds).

If, on the other hand, coil 12 is an open circuit, the voltage on lines 24 and 36 will still go high after the test output is initiated on line 34, and comparator 40 will transmit the first comparison signal as logic low to computer 14 via line 54 at the first point in time. However, the current flow through coil 12 will not increase because of the open circuit, and, as a result, the voltage on lines 24 and 36 will remain high, the output on comparator 40 will remain low, and computer 14 will not receive the second comparison signal as logic high at the second point in time —5 milliseconds after the test output was initiated. Thus, if computer 14 does not receive the first comparison signal at the first point in time, or does not receive the second comparison signal at the second point in time, a defect in the electrical integrity of coil 12 is indicated, and computer 14 is programmed to actuate alarm 16.

Figure 2:
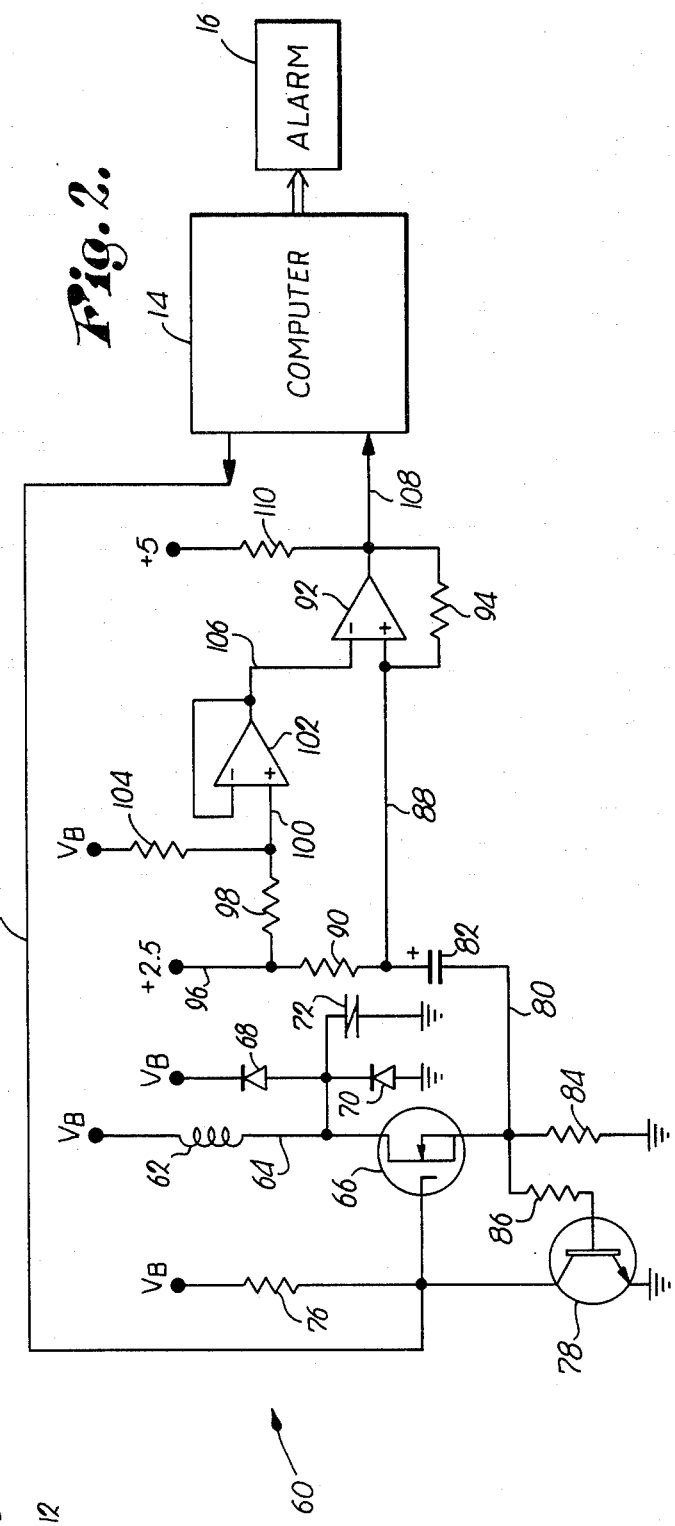
FIG. 2 is a partial schematic and partial block diagram of the second embodiment of the present invention.

The second embodiment of the present invention as illustrated in FIG. 2 is particularly useful in testing the electrical integrity of a solenoid which is used to actuate a mechanism such as a hydraulic cylinder, for example. With such an arrangement, one side of the solenoid is typically clamped to a supply voltage. If the supply voltage is provided by an automative or tractor battery system, the voltage is subject to variation depending on the electrical load imposed on the vehicle electrical system. Because of this, the circuit compensates for these variations in order to maintain the accuracy of the electrical integrity test. Additionally, the circuit is designed to insure that the test is complete and the coil deenergized before the coil is energized for a sufficient length of time to actuate the mechanism.

FIG. 2 illustrates circuit 60 which is the second embodiment of the present invention preferred for applications with solenoid coils demanding high current flows. Circuit 60 preferably includes computer 14 and alarm 16 as discussed in connection with FIG. 1 and is coupled with inductive solenoid 62. One side of solenoid 62 in the environment of use herein described is connected to the vehicle battery which supplies voltage $V_B$ typically at +12 v.d.c. with reference to ground. Circuit 60 also receives operating power from a conventional power supply at +5 v.d.c. and +2.5 v.d.c. As those skilled in the art will appreciate, even though the battery supply voltage $V_B$ may vary, a conventional power supply can still maintain the lower voltages at +5 v.d.c. and +2.5 v.d.c. at a very stable level.

The other side of coil 62 is connected via line 64 to the source terminal of a conventional field effect transistor (FET) 66, to the anode of diode 68, to the cathode of diode 70, and to one side of EMI suppression filter 72. The cathode of diode 68 receives battery supply voltage $V_B$. The other side of diode 70 is connected to ground as shown and the other side of suppression filter 72 is also connected to ground as shown. Diode 68 is provided to suppress voltage spikes when the current flow through coil 62 is interrupted. Diode 70 is provided for static suppression and filter 72 is provided for radio frequency suppression.

The gate terminal of FET 66 is coupled with and receives a test output from computer 14 via line 74. Line 74 is also connected to one side of pull-up resistor 76 (1K ohms) the other side of which is connected to battery voltage $V_B$, and to the collector of transistor 78. The emitter of transistor 78 is connected to ground as shown.

The drain terminal of FET 66 is connected via line 80 to one side of coupling capacitor 82 (10 microfarards), to one side of load sensing resistor 84 (0.27 ohms), and to one side of resistor 86 (1K ohms).

The other side of resistor 86 is connected to the base of transistor 78. Transistor 78 and resistor 86 are included in circuit 60 to provide circuit protection in the event coil 62 is shorted. That is to say, if excessive current flows through coil 62, line 64, FET 66, line 80, and resistor 84, the high voltage drop cross resistor 84 will be transmitted via resistor 86 to the base of transistor 78 which will switch on to pull line 74 low in order to turn off FET 66, which will then switch off to stop the excessive current flow.

The other side of load resistor 84 is connected to ground as shown.

The other side of capacitor 82 is connected via line 88 to one side of biasing pull-up resistor 90 (10K ohms), to the positive input terminal of comparator 92 (National Semiconductor LM2901) and to one side of resistor 94 (1M ohms).

The other side of resistor 90 is connected via line 96 to +2.5 v.d.c. and to one side of resistor 98 (1.5K ohms). The other side of resistor 98 is connected via line 100 to the positive input terminal of operational amplifier 102 (National Semiconductor LM2902) and to one side of resistor 104 (100K ohms). The other side of resistor 104 is connected to battery voltage $V_B$.

The output of amplifier 102 is connected via line 106 to the negative input terminal of amplifier 102 and to the negative input terminal of comparator 92.

The output of comparator 92 is connected via line 108 to the other side of resistor 94, to one side of pull-up resistor 110 (10K ohms), and to computer 14. Resistor 94 is included to provide hysteresis in the operation of comparator 92.

In the operation of circuit 60 before the initiation of a test of solenoid 62, computer 14 pulls line 74 to logic low at zero volts, FET 66 is off, line 88 is biased at +2.5 v.d.c. via resistor 90, capacitor 82 is likewise charged at +2.5 v.d.c., and the input at the positive terminal comparator 92 is also at +2.5 v.d.c.

Amplifier 102 is connected as a voltage follower to provide unitary gain. The positive input terminal of amplifier 102 is nominally biased at +2.64 v.d.c. which provides a reference signal output via line 106 at that same voltage to the negative input terminal of comparator 92. The positive input terminal of amplifier 102 receives biasing voltage at +2.5 v.d.c. via resistor 98 and the values chosen for resistors 98 and 104 determine the additional bias to bring the positive input terminal of amplifier 102 up to +2.64 v.d.c. As the battery voltage $V_B$ varies, the voltage on line 100 to the positive input terminal of amplifier 102 also varies proportionately. In this way, amplifier 102 provides a reference signal via line 106 to comparator 92 which signal varies in a manner corresponding to variations in voltage $V_B$. Comparator 92 receives the reference signal at +2.64 v.d.c. at the negative input terminal thereof which voltage is higher than the +2.5 v.d.c. biasing voltage at the positive terminal and comparator 92 output is thereby logic low at zero volts as input via line 108 to computer 14.

The operation of circuit 60 is similar to that of circuit 10 in that comparator 92 produces and delivers respective first and second comparison signals as logic low and logic high respectively which are read by computer 14 at respective first and second points in time. In the particular arrangement of circuit 60, the first and second points in time are one millisecond and 10 milliseconds respectively. The specific design of circuit 60 is configured so that the test of solenoid 62, which is complete 10 milliseconds after the test of output goes high via line 74, which is less than the time sufficient for solenoid 62 to actuate the mechanism to which it is operably coupled. That is to say, in the particular environment of use, it takes longer than 10 milliseconds for coil 62 to actuate the hydraulic cylinder coupled thereto.

To test coil 62, computer 74 activates the test output via line 74 by no longer sinking current which allows the voltage on line 74 to rise to logic high at about +5 v.d.c. as supplied by battery voltage $V_B$ via resistor 76 to the gate of FET 66. The voltage on line 74 switches on FET 66 which completes the circuit from battery supply voltage $V_B$ through coil 62, line 64, FET 66, line 80, and resistor 84. Coil 62 initially inhibits current flow and the current flow through load resistor 84 is initially very low. Thus, the voltage on line 80 is also initially low. As a result, the voltage on line 88 after one millisecond is still below the reference signal voltage from amplifier 102 and so the output from comparator 92 via line 108 remains logic low as the first comparison signal. Thus, computer 14 reads the first comparison signal as logic low via line 108 at the first point in time which is one millisecond after the test output was activated on line 74.

The current through coil 62 and thus through resistor 84 rises exponentially over time and the voltage on lines 80 and 88 similarly rise exponentially. When the voltage on line 88 exceeds the reference voltage on line 106, the output of comparator 92 goes logic high which is pulled up to +5 v.d.c. via resistor 110 to supply the second comparison signal to computer 14. The threshold level for the change of state of comparator 92 corresponds with a reference magnitude current flow through coil 62 so that as a matter design choice, the desired reference current flow magnitude through coil 62 can be changed by changing the magnitude of the reference voltage signal provided by amplifier 102.

At 10 milliseconds after the test output is activated on line 74, computer 14 reads the second comparison signal from comparator 92 via line 108 which completes the integrity verification of coil 62. Computer 14 then deactivates the test output via line 74 which completes the test of coil 62 before it can actuate any mechanism operably coupled thereto.

If coil 62 is short circuited, the current flow therethrough will be initially high as will the current flow through resistor 84. As a result, the voltage on lines 80 and 88 will also rise to a level exceeding the reference signal voltage 2.64 Volts before the first point in time at 1 millisecond. As a result, at 1 millisecond, the output from comparator 92 will provide a signal via line 108 to computer 14 as logic high rather than the expected first comparison signal as logic low. In such an event, computer 14 activates alarm 16 as indication of a defect in the electrical integrity of coil 62.

If coil 62 is an open circuit, no current will flow therethrough when the test output is activated on line 74. As a result, computer 14 will still receive the first comparison signal as logic low at the first point in time after 1 millisecond. However, after 10 milliseconds, the output from comparator 92 will remain low and computer 14 will not receive the second comparison signal as logic high at the second point in time at 10 milliseconds after the test output was initiated on line 74. In such an event, computer 14 will activate alarm 16 to indicate a defect in the integrity of coil 62.

Circuit 60 also compensates for variations in the supply voltage $V_B$ by varying the reference signal provided from amplifier 102 via line 106 as described above. If voltage $V_B$ drops when FET 66 switches on, the exponential rise in current flow through coil 62 will be at a rate lower than that nominally expected. As a result, the voltage rise on line 88 may not rise rapidly enough for comparator 92 to produce and deliver the second comparison signal to computer 14 by 10 milliseconds. If this were to occur, a false indication of a defect in the integrity of coil 62 would be indicated.

To avoid such a false indication, a drop in supply voltage $V_B$ also causes a corresponding drop in the reference signal voltage supplied by amplifier 102 via line 106 to comparator 92 so that comparator 92 changes state at the same relative time in the test sequence. That is to say, even if voltage $V_B$ drops, comparator 92 will still provide the second comparison signal during the second point in time at 10 milliseconds. Thus, computer 14 will not determine a false indication of a defect in coil 62.

Circuit 60 operates in an analogous manner the voltage level of the reference signal.

Those skilled in the art will recognize that circuits 10 and 60 can also be used for the on-line operation of coil 12 and solenoid 62 respectively. For example, in the operation of circuit 10, when coil 12 produces a rising voltage pulse, the output of comparator 40 provides a corresponding logic low pulse via lines 48 and 54 to computer 14. By means of an appropriate operating program for computer 14, computer 14 can count the number of pulses and thereby count the number of revolutions as data of the rotating member associated with coil 12 which data may be used in the operation of other devices coupled with computer 14.

Analogously, circuit 60 can be used to actuate coil 62 and its associated hydraulic cylinder, for example. That is to say, coil 62 is actuated if line 74 goes high for a sufficient length of time. Since this length of time is greater than the 10 milliseconds needed to conduct the coil integrity test, computer 14, if desired, can be programmed to conduct this test each time coil 62 is activated via line 74. In other words, if desired the program of computer 14 can keep line 74 activated beyond 10 milliseconds in order to actuate the mechanism operably coupled with coil 62. Advantageously, computer 14 can be advantageouly programmed to initiate the integrity test of coil 62 at more frequent intervals.

Figure 3:
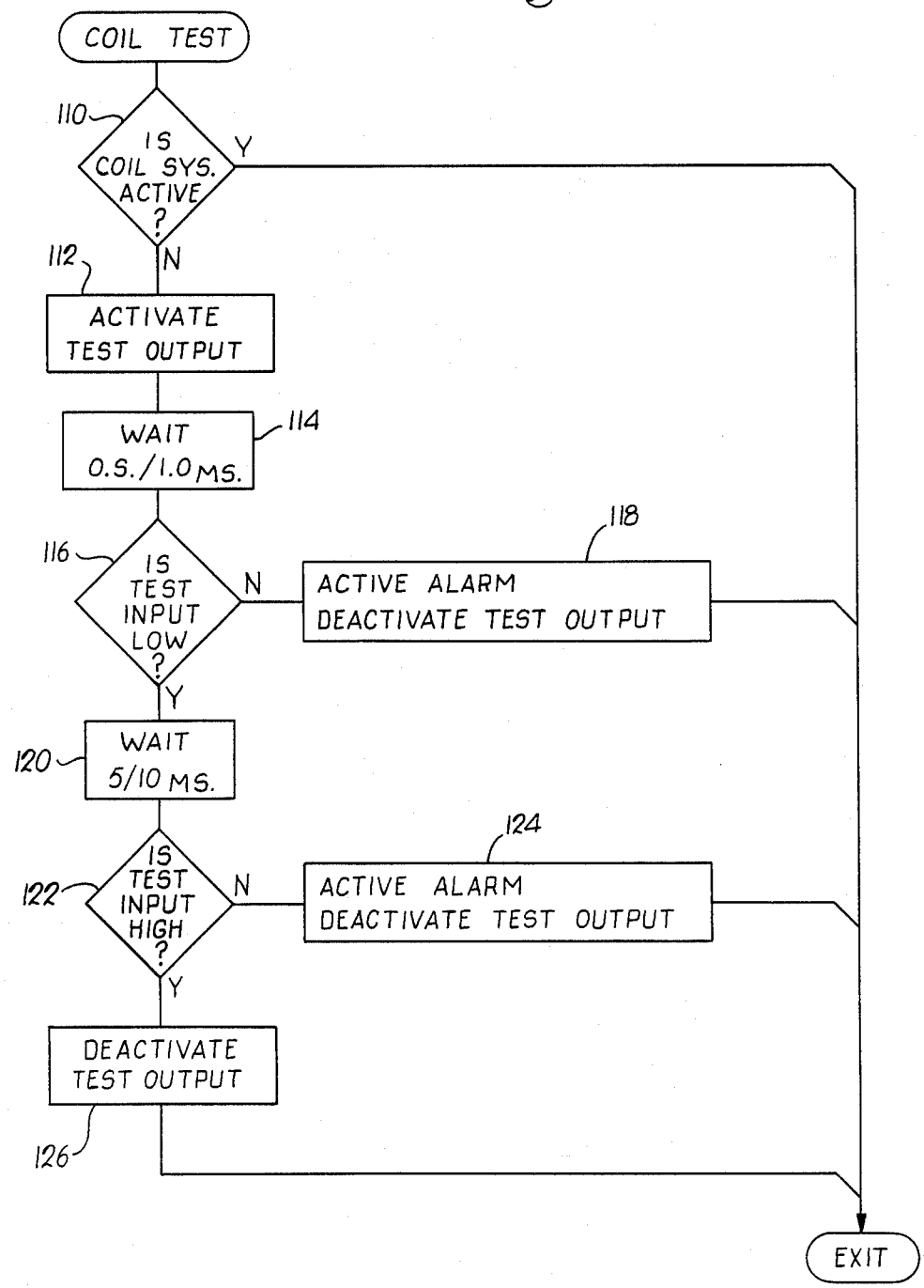
FIG. 3 is a computer program flowchart in accordance with the present invention.

FIG. 3 illustrates a computer program flowchart of the sub-routine COIL TEST which can be advantageously incorporated as part of the overall operating program for computer 14. The sub-routine COIL TEST is applicable to both circuits 10 and 60 with appropriate adaptations as explained further hereinbelow.

The operating program enters sub-routine COIL TEST at step 110 which asks whether the coil or solenoid system is active. This step is included so that the program does not attempt to conduct a test of coil 12 or solenoid 62 during the time when coil 12 is delivering a pulse, for example, or during the time that computer 14 is attempting to actuate the hydraulic cylinder associated with coil 62. If the two systems are active, the program exits subroutine COIL TEST.

If the coil or solenoid system is not active, the program moves to step 112 to activate the test output via lines 34 or 74 as appropriate. The program then moves to step 114 where the subroutine waits for 0.5 milliseconds in case of circuit 10 and 1 millisecond in the case of circuit 60 which allows the respective circuits time to activate. At the end of the waiting time (first point in time), the program moves to step 116 which asks whether the test input is low. That is to say, at the first point in time, computer 14 reads the respective input via lines 54 or 108 to see whether the first comparison signal is being received which is a logic low signal for both circuits.

If the first comparison signal is not being received, a defect in coil or solenoid integrity is indicated, that is, a short circuit. In such an event, the program moves to step 118 to activate alarm 16 and to deactivate the test output via lines 34 or 74. The test output is deactivated because if a coil or solenoid defect is indicated in step 116, further conduct of the test in unnecessary in that a coil defect is already detected. After step 118 the program exits.

If, however, as normally expected, the test input as determined in step 116 is logic low, the program moves to step 120 in order to wait for 5 milliseconds in the case of circuit 10 and 10 milliseconds in the case of circuit 60 until the second point in time at which point the program moves to step 122 which asks whether the test input is high via lines 54 or 108. That is to say, at the second point in time, computer 14 should receive a logic high signal from respective circuits 10 or 60 via lines 54 or 108. If the second comparison signal is not received at the second point in time, the program moves to step 124 which activates alarm 16 and deactivates the test output via lines 34 or 74. The program then exits.

If computer 14 receives the second comparison signal at the second point in time in step 122, the coil test is complete and the program moves to step 126 to deactivate the test output. The program then exits sub-routine COIL TEST.

Those skilled in the art will appreciate that the present invention contemplates many variations in the specific circuits of the preferred embodiments herein described. For example, the first embodiment of FIG. 1 could also incorporate compensation for variations in supply voltage by substituting the network associated with amplifier 102 for the voltage supply $V_{REF}$ if desired.

Additionally, the two preferred embodiments describe two different circuits and methods for detecting the current flow through the respective inductive coils. For example, circuit 10 is configured to present an exponentially falling voltage indicative of current flow through coil 12. On the otherhand, circuit 60 is configured to present an exponentially rising voltage indicative of current flow through solenoid 62. Such circuit arrangements are a matter of design choice depending on the types of coils and solenoids to be tested, the voltage and current demands of each, and the way in which the respective coils and solenoids are connected for general overall operation. Those skilled in the art will recognize that there are a wide variety of other means and methods available for detecting current flow and for providing a signal indicative thereof. Similarly, those skilled in the art will appreciate that other means and methods are available for comparing signals indicative of current flow with a reference level and for determining whether the first and second comparison signals occur at the appropriate first and second points in time.

Having thus described the preferred embodiments of the present invention, the following is claimed as new and desired to be secured by Letters Patent:

1. A circuit for testing the electrical integrity of an inductive coil or solenoid, said circuit comprising:
   activatible voltage means for selectively imposing a direct current voltage on said coil or solenoid for inducing a current flow therethrough in response to said voltage;
   means for detecting said current flow and for producing a current flow signal indicative of the magnitude of said current flow;
   comparator means operatively coupled with said detecting means for receiving said current flow signal, for receiving a reference signal indicative of a reference current flow magnitude, and for comparing said current flow signal with said reference signal for producing a first comparison signal when said current flow magnitude is less than said reference magnitude and a second comparison signal when said current flow magnitude is greater than said reference magnitude; and
   determining means operatively coupled with said comparator means for receiving said comparison signals and for determining whether said first comparison signal is received during a first point in time occuring after said voltage is imposed and whether said second comparison signal is received during a later second point in time while said voltage is still imposed whereby determining reception of said respective comparison signals during said respective points in time is a test indicative of the electrical integrity of said coil or solenoid 2. The circuit as set forth in claim 1, further including an actuatable alarm operatively coupled with said determining means for actuation therefrom when said first comparison signal is absent during a first period of time and when said second comparison signal is absent during said second point in time.

3. The circuit as set forth in claim 1, said determining means including a digital computer.

4. The circuit as set forth in claim 3, further including an actuable alarm operatively coupled with said computer for actuation thereby whenever said comparison signal is absent during said first point in time or said second comparison signal is absent during said second point in time.

5. The circuit as set forth in claim 3, said computer including means for activating said voltage means and for deactivating said voltage means after said second point in time.

6. The circuit as set forth in claim 1, said current flow signal being a voltage directly proportional to said circuit flow magnitude.

7. The circuit as set forth in claim 1, said current flow signal being a voltage inversely proportional to said current flow magnitude.

8. The circuit as set forth in claim 1, said coil or solenoid being operative coupled with a mechanism for actuation by said coil or solenoid when said voltage is imposed thereon for a sufficient length of time, the time interval between the point in time when said voltage is initially imposed and said second point in time being less than said sufficient length of time, whereby said test is complete before actuation of said mechanism.

9. The circuit as set forth in claim 1, said voltage being subject to variations in the magnitude thereof whereby said variations induce corresponding variations in said current flow, said circuit including means for compensating for said variations in order to maintain the reliablity of said test, said compensating means including --
means for sensing said variations in said voltage, and
means coupled with said sensing means for varying said reference signal in a manner corresponding to said variations.

10. The circuit as set forth in claim 5, said coil or solenoid being operatively coupled with a mechanism for actuation by said coil, coil or solenoid when said voltage is imposed thereon for a sufficient length of time, the time interval between the point in time when said voltage is initially imposed and said second point in time being less than said sufficient length of time whereby a testing procedure is complete before actuation of said mechanism.

11. The circuit as set forth in claim 5, said voltage being subject to variations in the magnitude thereof whereby said variations induce corresponding variations in said current flow, said circuit including means for compensating for said variations in order to maintain the reliability of said test, said compensating means including --
means for sensing said variations in said voltage, and
means coupled with said sensing means for varying said reference signal in a manner corresponding to said variations.

12. The circuit as set forth in claim 11, said coil or solenoid being operatively coupled with a mechanism for actuation by said coil or solenoid when said voltage is imposed thereon for a sufficient length of time, the time, interval between the point in time when said voltage is initially imposed and said second point in time being less than said sufficient length of time whereby a testing procedure is complete before actuation of said mechanism.

13. A method for testing the electrical integrity of an inductive coil, solenoid, or the like, said method comprising the steps of:
using an activatible voltage means for selectively imposing a direct current voltage on said coil, solenoid, or the like for inducing a detectable current flow therethrough in response to said voltage;
detecting said current flow and producing a current flow signal indicative of the magnitude of said current flow;
comparing said current flow signal with a reference signal indicative of a reference current flow magnitude;
producing a first comparison signal when said current flow magnitude is less than said reference magnitude and producing a second comparison signal when said current flow magnitude is greater than said reference magnitude; and
determining whether said first comparison signal is being produced during a first point in time occuring after said voltage is imposed and whether said second comparison signal is being produced during a later second point in time whereby production of said respective comparison signals during said respective points in time is a test indicative of the electrical integrity of said coil, solenoid, of the like.

14. The method as set forth in claim 13, said coil, solenoid, or the like being operatively coupled with a mechanism for actuation by said coil, solenoid, or the like when said voltage is imposed thereon for a sufficient length of time, said method further including the step of determining whether production of said respective comparison signals has occured during said respective points in time before said sufficient length of time has elapsed after initiation of said voltage.

15. The method as set forth in claim 13, said determining step including the step of receiving said comparison signals in a computer and using said computer for determining whether said respective comparison signals have been received by said computer during said respective point in time, said method further including the step of activating said voltage means by said computer.

16. The method as set forth in claim 13, said voltage being subject to variations in the magnitude thereof whereby said variations induce corresponding variations in said current flow, said method further including the steps of compensating for said variations by sensing said variations in said voltage and varying said reference signal in a manner corresponding to said variations.

17. The method as set forth in claim 13, further including the step of actuating an alarm whenever said first comparison signals not received during said first point in time or whenever said second comparison signal is not received during said second point in time.

18. A method for testing the electrical integrity of an inductive coil, solenoid, or the like which is operatively coupled with a circuit for producing and delivering to a computer a first signal when the magnitude of current flow through said coil, solenoid, or the like is less than a reference magnitude and for producing and delivering a second signal when said current flow magnitude is greater than said reference magnitude, said computer having an activatible test output for activating the imposition of a direct current voltage on said coil, solenoid, or the like for inducing said current flow, said method comprising the steps of:
activating said test output;
determining whether said computer is receiving said first signal during a first point in time occuring after said activating step;
determining whether said computer is receiving said second signal during a later second point in time after said computer has received said first signal during said first point in time; and
deactivating said test output.

19. The method as set forth in claim 18, further including the steps of:
actuating an alarm when said first signal is absent during said first point in time, and
actuating an alarm when said second signal is absent during said second point in time after said computer has received said first signal during said first point in time.

* * * * *